United States Patent
Chen et al.

(10) Patent No.: US 9,778,712 B2
(45) Date of Patent: Oct. 3, 2017

(54) METHOD OF INTEGRATING A SERVER USING ALTERNATING CURRENT POWER INTO A SERVER SYSTEM USING DIRECT CURRENT POWER AND ALTERNATIVE JUNCTION DEVICE THEREFOR

(71) Applicants: LITE-ON ELECTRONICS (GUANGZHOU) CO., LTD., Guangzhou (CN); LITE-ON TECHNOLOGY CORPORATION, Taipei (TW)

(72) Inventors: Shih-Ming Chen, Tainan (TW); Tsung-Wen Chang, Tainan (TW); Wen-Che Tsai, Tainan (TW); Jin-Yuan Lai, Kaohsiung (TW)

(73) Assignees: LITE-ON ELECTRONICS (GUANGZHOU) CO., LTD., Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/085,579

(22) Filed: Mar. 30, 2016

(65) Prior Publication Data
US 2017/0212565 A1    Jul. 27, 2017

(30) Foreign Application Priority Data
Jan. 27, 2016   (TW) .............................. 105102454 A

(51) Int. Cl.
*G06F 1/26* (2006.01)
*G06F 1/18* (2006.01)
*H05K 7/14* (2006.01)

(52) U.S. Cl.
CPC ................ *G06F 1/26* (2013.01); *G06F 1/188* (2013.01); *G06F 1/189* (2013.01); *H05K 7/1487* (2013.01)

(58) Field of Classification Search
CPC ........ G06F 1/188; G06F 1/189; H05K 7/1487
See application file for complete search history.

(56) References Cited

U.S. PATENT DOCUMENTS

2007/0025090 A1*   2/2007   Belady ................. H05K 7/1492
                                                                361/724
2014/0159497 A1*   6/2014   Chen ........................ G06F 1/28
                                                                307/82

FOREIGN PATENT DOCUMENTS

TW         302088         4/1997
TW         328403         3/1998

OTHER PUBLICATIONS

Office Action issued in corresponding Taiwan Patent Application No. 105102454 dated Mar. 30, 2017.

* cited by examiner

*Primary Examiner* — Albert Wang
(74) *Attorney, Agent, or Firm* — K&L Gates LLP

(57) ABSTRACT

The invention provides a method of integrating a server using alternating current power (AC server) into a server system using direct current power (DC server system) and an alternative junction device therefor. The integrating method includes: providing an AC server having a plug-in power supply unit; providing an alternative junction device for replacing the plug-in power supply unit; extracting the plug-in power supply unit from the AC server; plugging the alternative junction device into the AC server; and coupling the alternative junction device to a direct current power supply unit of a DC server system. The alternative junction device includes: a shell to be installed into a containing slot (Continued)

of an AC server; an output coupled to a DC input of a processor of the AC server when the shell is installed into the containing slot; and an input coupled to a DC power supply unit of a DC server system.

11 Claims, 5 Drawing Sheets

METHOD OF INTEGRATING A SERVER USING ALTERNATING CURRENT POWER INTO A SERVER SYSTEM USING DIRECT CURRENT POWER AND ALTERNATIVE JUNCTION DEVICE THEREFOR

RELATED APPLICATIONS

This application claims the benefit of Taiwan Patent Application No. 105102454, filed on Jan. 27, 2016, at the Taiwan Intellectual Property Office, the entire disclosure of which is incorporated herein by reference.

FIELD OF THE INVENTION

The present invention relates to an integrating method for a server system and a device for the integrating method, specifically a method of integrating a server using alternating current (AC) power into a server system using direct current (DC) power and an alternative junction device for the integrating method.

BACKGROUND OF THE INVENTION

The servers used in the present data center are basically grouped into two types. One is associated with a server using alternating current (AC) power (hereinafter referred to as AC server) and the other is associated with a server using direct current (DC) power (hereinafter referred to as DC server), and the AC servers prevail on the market. However, in order to improve efficiency, save energy and reduce carbon emission, the DC servers are heavily used in enterprises nowadays. Because the input power for the AC server and that for the DC server are different, the power supply units for the AC server and the DC server are different. It results in that the AC server cannot be applied in the framework of the server system using DC power, and thus the original AC servers will be weeded out when the server system using DC power is adopted and it increases the facility costs. Therefore, if the original AC servers supposed to be discarded can be integrated into the server system using DC power, the facility costs will decrease.

In order to circumvent all the above issues, the inventors have proposed an invention "METHOD OF INTEGRATING A SERVER USING ALTERNATING CURRENT POWER INTO A SERVER SYSTEM USING DIRECT CURRENT POWER AND ALTERNATIVE JUNCTION DEVICE THEREFOR." Using the integrating method and the device of the present invention, the AC servers can be integrated into the server system using DC power so as to decrease the costs of the server system. The summary of the present invention is described as follows.

SUMMARY OF THE INVENTION

According to the first aspect of the present invention, a method of integrating a server using alternating current (AC) power into a server system using direct current (DC) power is provided and includes the steps of: providing the server using AC power, wherein the server using AC power has a plug-in power supply unit, a containing slot and a processor, the plug-in power supply unit has a shell, an alternating current (AC) input and a direct current (DC) output, the processor has a direct current (DC) input, and the plug-in power supply unit is configured to be inserted into the containing slot so as to make the DC output of the plug-in power supply unit be coupled to the DC input of the processor; providing an alternative junction device (AJD) having a shell, an input and an output; extracting the plug-in power supply unit from the containing slot of the server using AC power; plugging the alternative junction device into the containing slot of the server using AC power so as to make the output of the alternative junction device be coupled to the DC input of the processor; and coupling the input of the alternative junction device to a direct current (DC) power supply unit of the server system using DC power.

Preferably, the shell of the plug-in power supply unit and the shell of the alternative junction device have the same shape.

Preferably, the output of the alternative junction device is directly connected to the DC input of the processor.

Preferably, the alternative junction device further comprises a busbar configured to couple the output of the alternative junction device and the input of the alternative junction device.

Preferably, the alternative junction device further comprises an auxiliary unit coupled to the busbar. Furthermore, the auxiliary unit can be a heat dissipation device, a storage device, a battery, an additional processor, a transmitting/receiving unit or a combination thereof.

According to the second aspect of the present invention, an alternative junction device for integrating a server using alternating current (AC) power into a server system using direct current (DC) power is provided. The server using AC power has a containing slot containing a plug-in power supply unit and has a processor having a direct current (DC) input, and the server system using DC power has a direct current (DC) power supply unit. The alternative junction device includes a shell configured to be installed into the containing slot of the server using AC power; an output configured to be coupled to the DC input of the processor when the shell is installed into the containing slot; and an input configured to be coupled to the DC power supply unit of the server system using DC power.

Preferably, the alternative junction device further includes a busbar coupled to the output and the input.

Preferably, the alternative junction device farther includes an auxiliary unit configured to be coupled to the busbar. Furthermore, the auxiliary unit can be a heat dissipation device, a storage device, a battery, an additional processor, a transmitting/receiving unit or a combination thereof.

According to the third aspect of the present invention, a method of integrating a server using alternating current (AC) power into a server system using direct current (DC) power is provided. The integrating method includes the steps of providing the server using AC power, which has a power supply unit and a processor, wherein the power supply unit has an alternating current (AC) input and a direct current (DC) output, and the processor has a direct current (DC) input; providing an alternative junction device having an input and an output; removing the power supply unit from the server using AC power; installing the alternative junction device into the server using AC power so as to make the output of the alternative junction device be coupled to the DC input of the processor; and coupling the input of the alternative junction device to a direct current (DC) power output of the server system using DC power.

The present invention provides a method of integrating a server using alternating current (AC) power into a server system using direct current (DC) power and an alternative junction device for the integrating method. Because the alternative junction device replaces the plug-in power supply unit, the AC server can use the DC power via the alternative junction device. Therefore, the AC server can be integrated into the DC server system.

The present invention will be more clearly understood through the following descriptions with reference to the drawings:

DETAILED DESCRIPTION OF THE PREFERRED EMBODIMENTS

Figure 1:
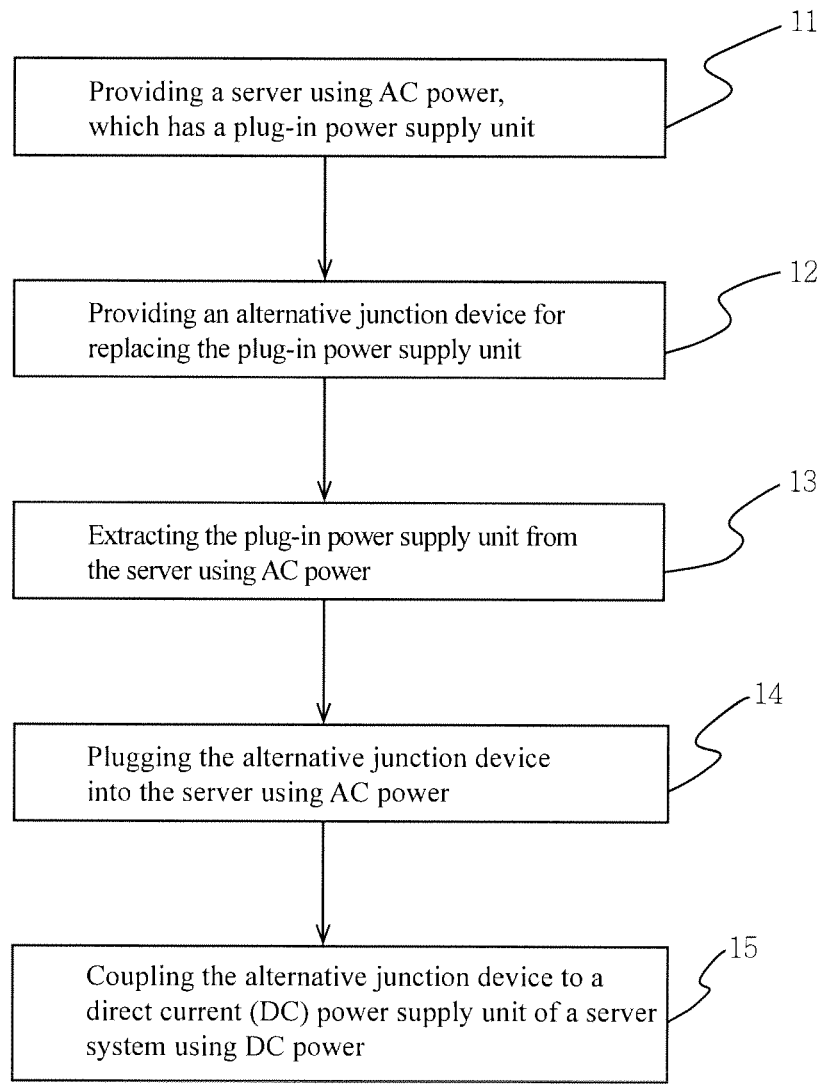
FIG. 1 shows the flow of the method of integrating a server using alternating current (AC) power into a server system using direct current (DC) power according to the present invention.

Please refer to FIG. 1 which shows the flow of the method of integrating a server using alternating current (AC) power into a server system using direct current (DC) power according to the present invention. The integrating method 10 includes the following steps: providing a server using AC power, which has a plug-in power supply unit (Step 11); providing an alternative junction device for replacing the plug-in power supply unit (Step 12); extracting the plug-in power supply unit from the server using AC power (Step 13); plugging the alternative junction device into the server using AC power (Step 14); and coupling the alternative junction device to a direct current (DC) power supply unit of a server system using DC power (Step 15). The Steps in the integrating method 10 are described as follows.

Figure 2:
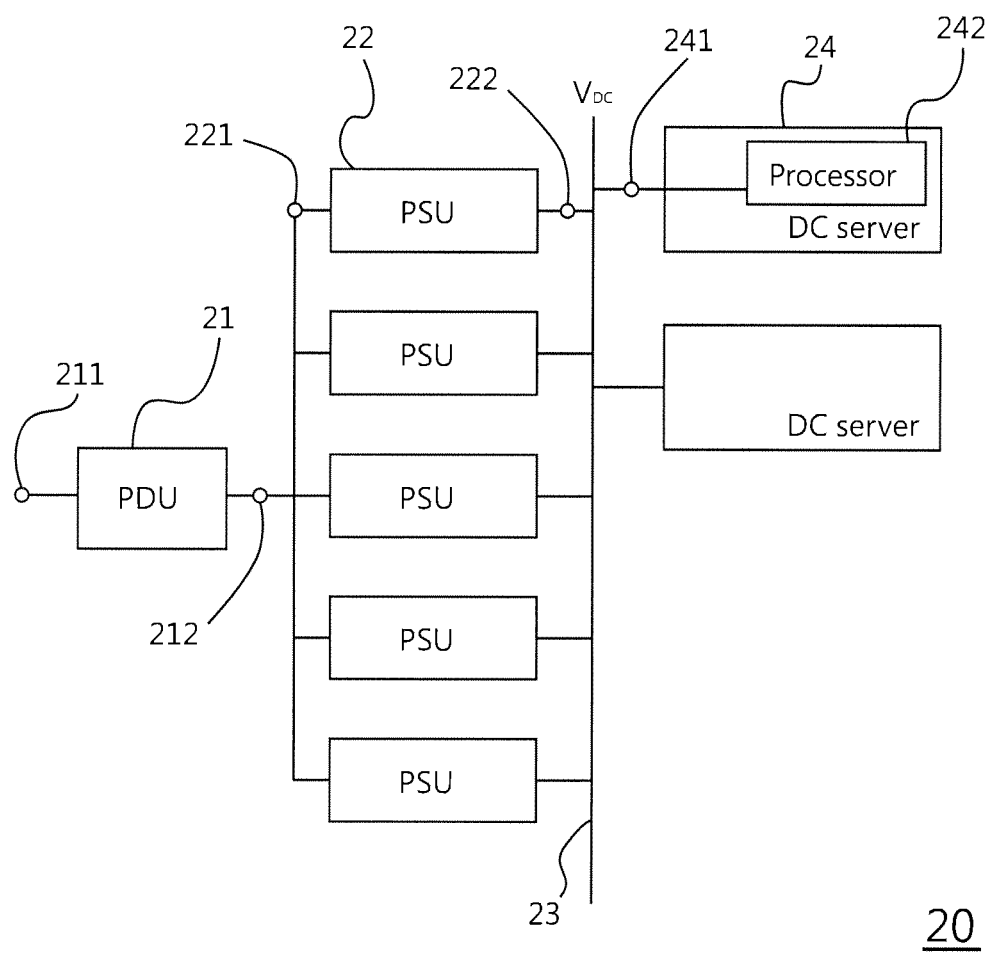
FIG. 2 is a schematic diagram showing the server system using DC power in the integrating method according to the present invention.

Please refer to FIG. 2 which is a schematic diagram showing the server system using DC power in the integrating method according to the present invention. The server system using DC power (DC server system) 20 in the integrating method 10 includes a power distribution unit (PDU) 21, a plurality of power supply units (PSU) 22, a $V_{DC}$ voltage bus 23 and a server using DC power (DC server) 24. The PDU 21 has an AC power input 211 and an AC power output 212, each of the plurality of PSUs 22 has an AC power input 221 and a DC power output 222, and the DC server 24 has a DC power input 241 and a processor 242. The power source for the DC server system 20 is commercial AC power. The commercial AC power is transmitted to the AC power input 211 of the PDU 21, and the PDU 21 distributes power to the plurality of PSUs 22 via the AC power output 212 so as to generate low voltage DC power to the $V_{DC}$ voltage bus 23. The $V_{DC}$ voltage bus 23 provides DC power for the servers in the whole DC server system 20, and namely the power supply of the DC server system 20 is to provide DC power for the various devices in the DC server system 20.

Figure 3A:
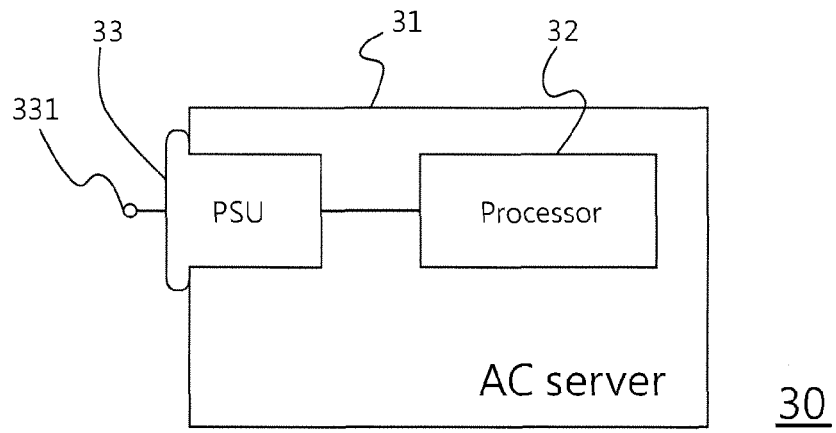
FIG. 3(a) and FIG. 3(b) are the schematic diagrams showing the server using AC power in the integrating method according to the present invention.
Figure 3B:
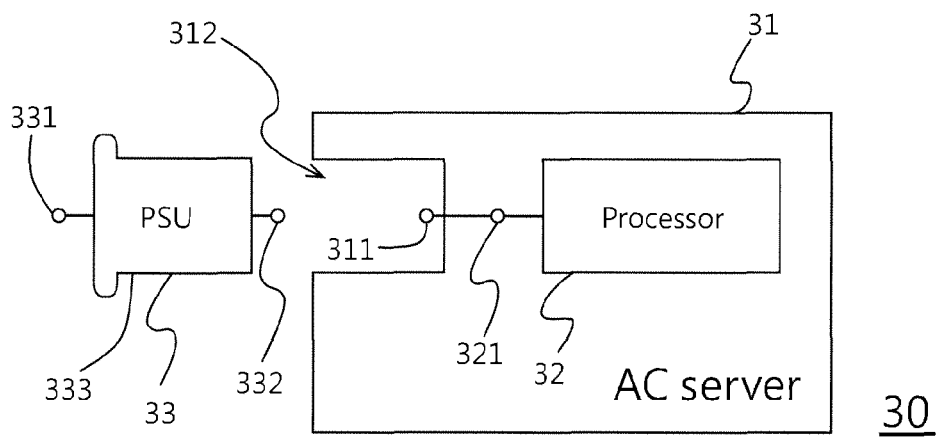

The Step 11 in the integrating method 10 is to provide a server using AC power (AC server), which has a plug-in power supply unit. Please refer to FIG. 3(a) and FIG. 3(b) which are the schematic diagrams showing the server using AC power in the integrating method according to the present invention. The server using AC power (AC server) 30 in Step 11 of the integrating method 10 includes a server casing 31, a processor 32 and a plug-in power supply unit 33. The server casing 31 has a DC power input 311 and a containing slot 312, the processor 32 has a DC power input 321, and the plug-in power supply unit 33 has an AC power input 331, a DC power output 332 and a shell 333. The power source of the operating AC server 30 is AC power, the AC power is transmitted to the plug-in power supply unit 33 via the AC power input 331 so as to generate a DC power, and the DC power is transmitted to the processor 32 via the DC power output 332 of the plug-in power supply unit 33, the DC power input 311 of the server casing 31 and the DC power input 321. In other words, the AC server 30 requires AC power to operate normally.

Figure 3C:
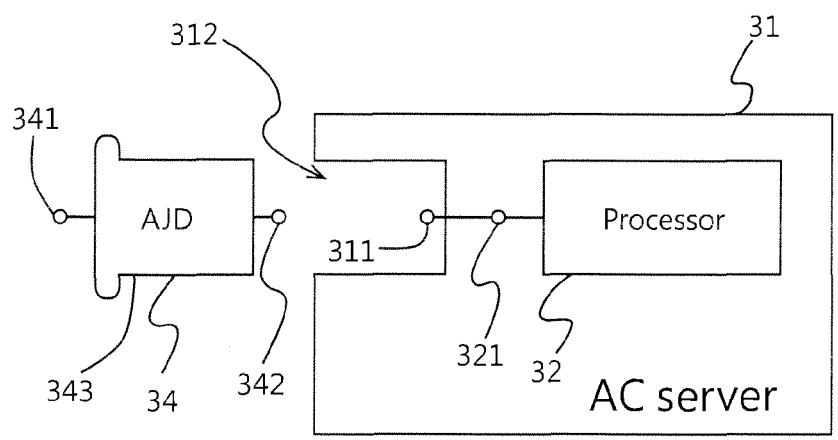
FIG. 3(c) is a schematic diagram showing the server using AC power and the alternative junction device in the integrating method according to the present invention.

The Step 12 in the integrating method 10 is to provide an alternative junction device for replacing the plug-in power supply unit. Please refer to FIG. 3(c) which is a schematic diagram showing the server using AC power and the alternative junction device in the integrating method according to the present invention. The alternative junction device (AJD) 34 in Step 12 of the integrating method 10 includes an input 341, an output 342 and a shell 343. The input 341 of the alternative junction device 34 is used to receive DC power, and the output 342 of the alternative junction device 34 is used to transmit the received DC power to the DC power input 311 of the server casing 31. In other words, the AC server 30 (originally driven by AC power only) can utilize DC power to operate using the alternative junction device 34.

The Step 13 in the integrating method. 10 is to extract the plug-in power supply unit from the server using AC power. Because the $V_{DC}$ voltage bus 23 in the DC server system 20 is used to provide DC power for all the devices in the DC server system 20, the AC server 30 already equipped with the plug-in power supply unit 33 cannot be configured in the DC server system 20. In other words, the AC power input 331 of the plug-in power supply unit 33 is configured to receive AC power rather than DC power. If a user wants to integrate the AC server 30 into the DC server system 20, the plug-in power supply unit 33 must be removed from the AC server 30. Please refer to FIG. 3(b), when the plug-in power supply unit 33 is extracted from the containing slot 312 of the server casing 31, the DC power input 311 of the server casing 31 of the AC server 30 is not connected to any external terminal.

The Step 14 in the integrating method 10 is to plug the alternative junction device into the server using AC server. When the alternative junction device 34 provided in Step 12 of the integrating method 10 is plugged into the containing slot 312 of the server casing 31, the output 342 of the alternative junction device 34 is connected to the DC power input 311 of the server casing 31. In other words, the alternative junction device 34 replaces the plug-in power supply unit 33 in the AC server 30, and thus the processor 32 in the AC server 30 can receive the DC power via the input 341 of the alternative junction device 34. Therefore, the AC server 30 can directly receive DC power to operate.

Figure 4:
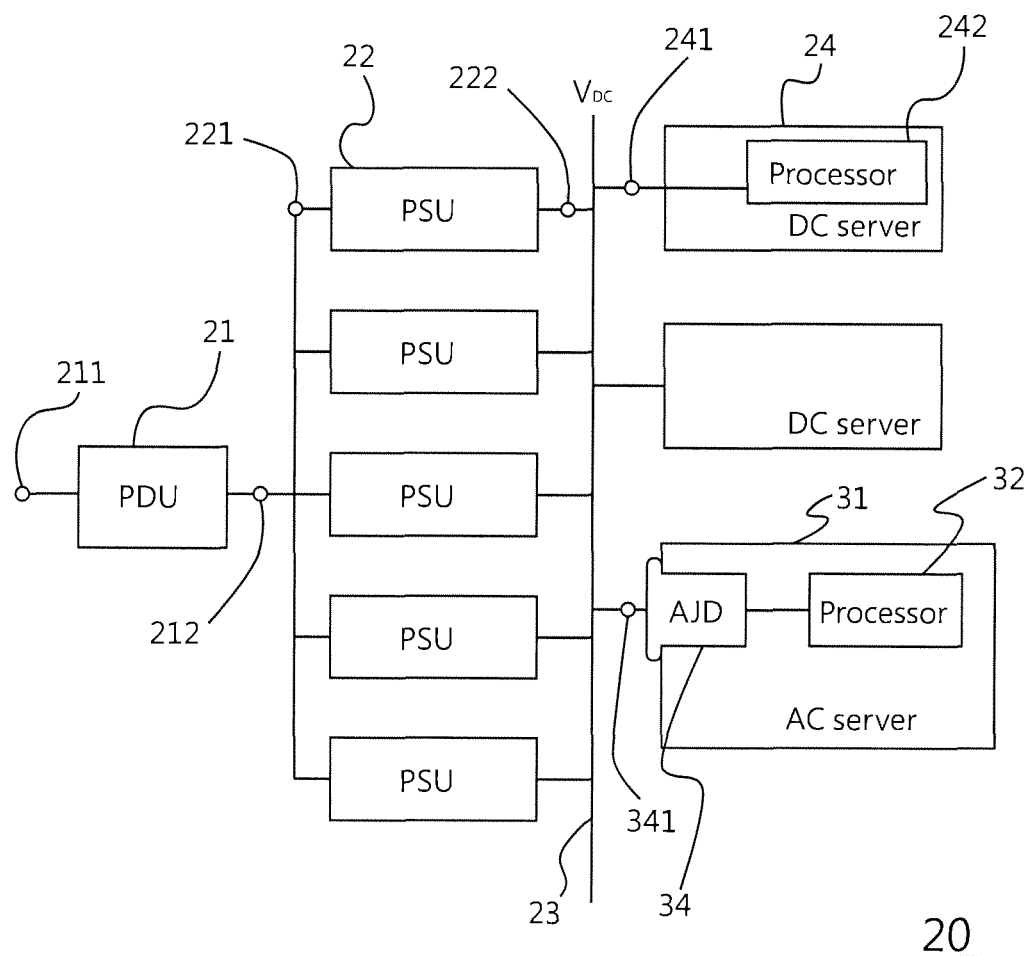
FIG. 4 is a schematic diagram showing the server using AC power integrated into the server system using DC power in the integrating method according to the present invention.

The Step 15 in the integrating method 10 is to couple the alternative junction device to a direct current (DC) power supply unit of a server system using DC power. Please refer to FIG. 4 which is a schematic diagram showing the server using AC power integrated into the server system using DC power in the integrating method according to the present invention. The power supply of the DC server system 20 in the integrating method 10 is the $V_{DC}$ voltage bus 23, and the $V_{DC}$ voltage bus 23 provides DC power for all the devices in the DC server system 20. Because the input 341 of the alternative junction device 34 does not limited only to inputting AC power, the input 341 of the alternative junction device 34 can be connected to the $V_{DC}$ voltage bus 23. Accordingly, the DC power provided by the $V_{DC}$ voltage bus 23 can be transmitted to the processor 32 of the AC server 30, and thus the AC server 30 can be integrated into the DC server system 20.

Figure 5:
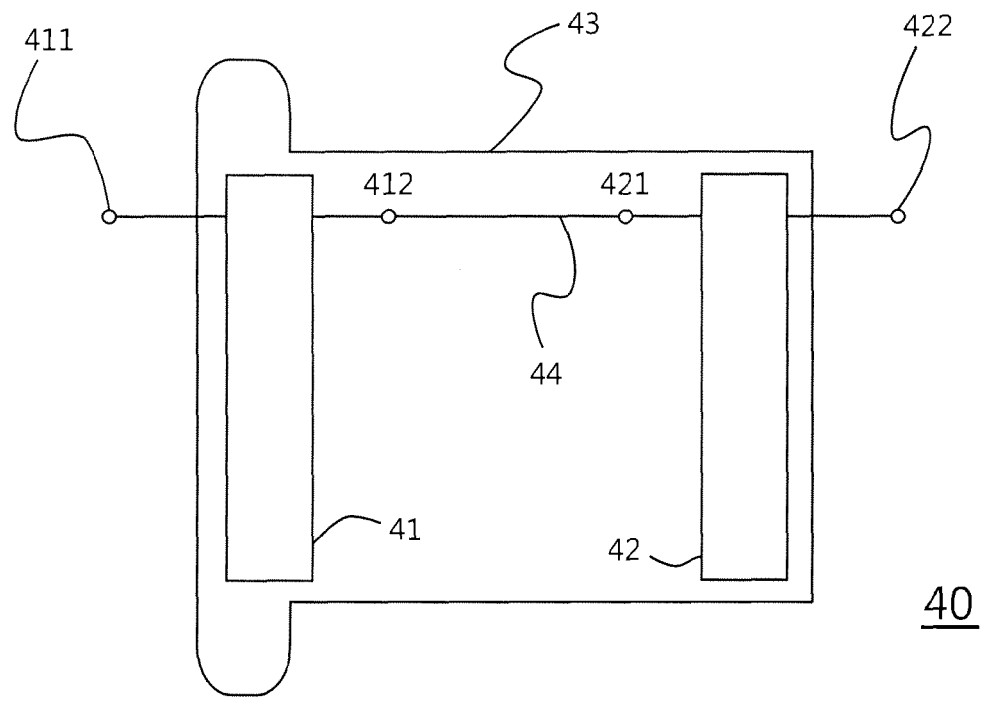
FIG. 5 is a schematic diagram showing the first embodiment of the alternative junction device according to the present invention.

Please refer to FIG. 5 which is a schematic diagram showing the first embodiment of the alternative junction device according to the present invention. The alternative junction device 40 includes a first connecting unit 41, a second connecting unit 42, a shell 43 and a bulbar 44, where the first connecting unit 41 has an input 411 and an output 412, the second connecting unit 42 has an input 421 and an output 422, and the busbar 44 connects the Output 412 of the first connecting unit 41 and the input 421 of the second connecting unit 42 so that the DC power transmitted to the input 411 of the first connecting unit 41 can be output by the output 422 of the second connecting unit 42 via the busbar 44. The shell 43 of the alternative junction device 40 is configured to be plugged into the containing slot of the AC server, and thus the shape of the shell 43 must match the shape of the containing slot to avoid that the alternative junction device 40 cannot enter the containing slot of the AC server. Accordingly, the output 422 of the second connecting unit 42 can be connected to the DC power input of the server casing of the AC server. Preferably, the shape of the shell 43 of the alternative junction device 40 is similar to or even the same as that of the plug-in power supply unit of the AC server to prevent the problem of assembling. When the alternative junction device 40 replaces the plug-in power supply unit, the AC server (only receiving AC power to operate originally) can receive DC power to operate. Therefore, the AC server can be integrated into the server system using DC power.

Figure 6:
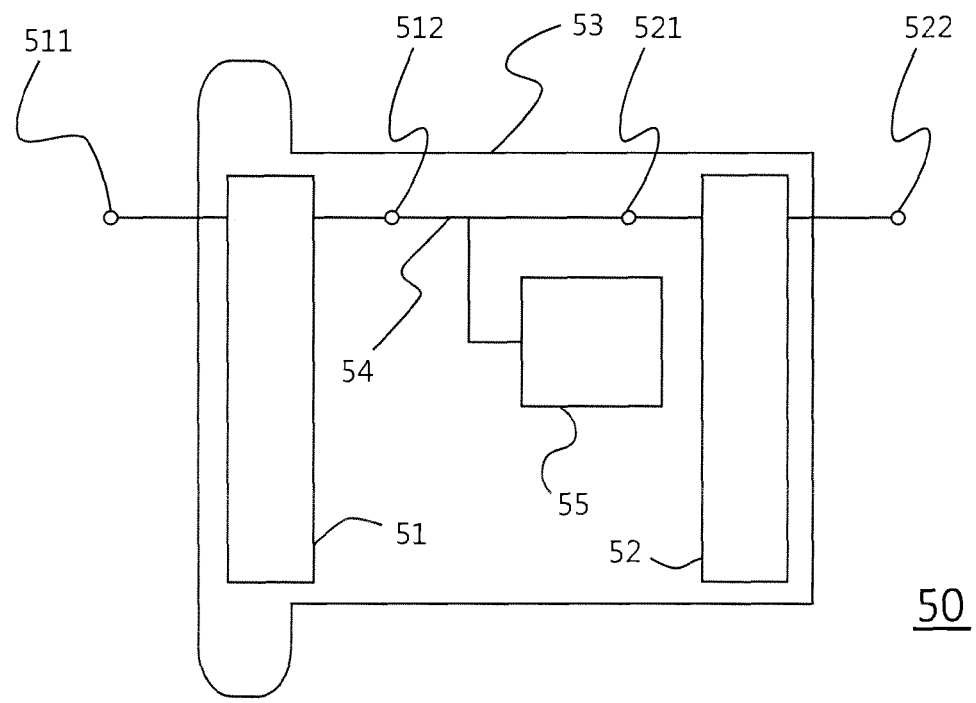
FIG. 6 is a schematic diagram showing the second embodiment of the alternative junction device according to the present invention.

Please refer to FIG. 6 which is a schematic diagram showing the second embodiment of the alternative junction device according to the present invention. The alternative junction device 50 includes a first connecting unit 51, a second connecting unit 52, a shell 53, a busbar 54 and an auxiliary unit 55, where the first connecting unit 51 has an input 511 and an output 512, the second connecting unit 52 has an input 521 and an output 522, the busbar 54 connects the output 512 of the first connecting unit 51 and the input 521 of the second connecting unit 52 so that the DC power transmitted to the input 511 of the first connecting unit 51 can be output by the Output 522 of the second connecting unit 52 via the busbar 54, and the auxiliary unit 55 is configured to be connected to the busbar 54. The auxiliary unit 55 can provide various additional functions, such as enhancing the data processing ability increasing the data storage capacity, enhancing the operating efficiency of the server, providing the backup power, providing the signal communication and management and so on. For example, if the auxiliary unit 55 is an additional processor, the AC server will enhance the data processing ability due to the fact that the AC server has one more processor than the original AC server without the auxiliary unit. If the auxiliary unit 55 is an additional storage device, the AC server will increase the data storage capacity due to the fact that the AC server has one more storage device than the original AC server without the auxiliary unit. If the auxiliary unit 55 is an additional heat dissipation device (such as a fail or a cooling system), the AC server will enhance the operating efficiency due to the fact that the AC server has one more heat dissipation device than the original AC server without the auxiliary unit. If the auxiliary unit 55 is an additional battery, the AC server will have the backup power due to the fact that the AC server has one more battery than the original AC server without the auxiliary unit. If the auxiliary unit 55 is a wireless transmitting/receiving unit (WTRU), the AC server will have the function of signal communication and management. Furthermore, the alternative junction device 50 can include more than one different auxiliary units to provide various additional functions.

When integrating a server system, the method of integrating a server using alternating current (AC) power into a server system using direct current (DC) power and an alternative junction device for the integrating method provided by the present invention can keep the original AC server in the DC power system to decrease the costs for the devices. Moreover, the volume of the alternative junction device (AJD) is less than that of the plug-in power supply unit and thus takes less space in the AC server. Therefore, the spare space can contain other auxiliary units, such as a hard disk, a fan, a cooling device, a battery and so on, to enhance the efficiency of the AC server used in the DC server system.

The invention need not be limited to the disclosed embodiments and the wording/terms, and it is intended to cover various modifications and similar arrangements included within the spirit of the present invention and the scope of the appended claims.

What is claimed is:

1. A method of integrating a server using alternating current (AC) power into a server system using direct current (DC) power, comprising:
    providing the server using AC power, which has a plug-in power supply unit, a containing slot and a processor, wherein the plug-in power supply unit has a shell, an alternating current (AC) input and a direct current (DC) output, the processor has a direct current (DC) input, and the plug-in power supply unit is configured to be inserted into the containing slot so as to make the DC output of the plug-in power supply unit be coupled to the DC input of the processor;
    providing an alternative junction device having a shell, an input and an output;
    extracting the plug-in power supply unit from the containing slot of the server using AC power;
    plugging the alternative junction device into the containing slot of the server using AC power so as to make the output of the alternative junction device be coupled to the DC input of the processor; and
    coupling the input of the alternative junction device to a direct current (DC) power supply unit of the server system using DC power.

2. The method as claimed in claim 1, wherein the shell of the plug-in power supply unit and the shell of the alternative junction device have the same shape.

3. The method as claimed in claim 1, wherein the output of the alternative junction device is directly connected to the DC input of the processor.

4. The method as claimed in claim 1, wherein the alternative junction device further comprises a busbar configured to couple the output of the alternative junction device and the input of the alternative junction device.

5. The method as claimed in claim 4, wherein the alternative junction device further comprises an auxiliary unit coupled to the busbar.

6. The method as claimed in claim 5, wherein the auxiliary unit is one selected from the group consisting of a heat dissipation device, a storage device, a battery, an additional processor, a transmitting/receiving unit and a combination thereof.

7. An alternative junction device for integrating a server using alternating current (AC) power into a server system using direct current (DC) power, wherein the server using AC power has a containing slot containing a plug-in power supply unit and has a processor having a direct current (DC) input, and the server system using DC power has a direct current (DC) power supply unit, the alternative junction device comprising:
 a shell configured to be installed into the containing slot of the server using AC power;
 an output configured to be coupled to the DC input of the processor when the shell is installed into the containing slot; and
 an input configured to be coupled to the DC power supply unit of the server system using DC power.

8. The alternative junction device as claimed in claim 7, further comprising a busbar, wherein the busbar is coupled to the output and the input.

9. The alternative junction device as claimed in claim 8, further comprising an auxiliary unit configured to be coupled to the busbar.

10. The alternative junction device as claimed in claim 9, wherein the auxiliary unit is one selected from the group consisting of a heat dissipation device, a storage device, a battery, an additional processor, a transmitting/receiving unit and a combination thereof.

11. A method of integrating a server using alternating current (AC) power into a server system using direct current (DC) power, comprising:
 providing the server using AC power, which has a power supply unit and a processor, wherein the power supply unit has an alternating current (AC) input and a direct current (DC) output, and the processor has a direct current (DC) input;
 providing an alternative junction device having an input and an output;
 removing the power supply unit from the server using AC power;
 installing the alternative junction device into the server using AC power so as to make the output of the alternative junction device be coupled to the DC input of the processor; and
 coupling the input of the alternative junction device to a direct current (DC) power output of the server system using DC power.

* * * * *